(12) United States Patent
Cusin et al.

(10) Patent No.: US 9,511,990 B2
(45) Date of Patent: Dec. 6, 2016

(54) COMPLEX MICROMECHANICAL PART

(75) Inventors: Pierre Cusin, Villars-Burquin (CH); David Richard, Yverdon-les-Bains (CH); Philippe Dubois, Marin (CH)

(73) Assignee: Nivarox-FAR S.A., Le Locle (CH)

( * ) Notice: Subject to any disclaimer, the term of this patent is extended or adjusted under 35 U.S.C. 154(b) by 544 days.

(21) Appl. No.: 13/983,682

(22) PCT Filed: Jan. 5, 2012

(86) PCT No.: PCT/EP2012/050127
§ 371 (c)(1),
(2), (4) Date: Oct. 15, 2013

(87) PCT Pub. No.: WO2012/104110
PCT Pub. Date: Aug. 9, 2012

(65) Prior Publication Data
US 2014/0033848 A1    Feb. 6, 2014

(30) Foreign Application Priority Data
Feb. 3, 2011  (EP) .................... 11153243

(51) Int. Cl.
*B22C 7/00*    (2006.01)
*B22D 19/00*   (2006.01)
(Continued)

(52) U.S. Cl.
CPC .......... *B81B 1/006* (2013.01); *B81C 1/00634* (2013.01); *B81C 99/0085* (2013.01); *B81B 2201/035* (2013.01); *Y10T 74/19949* (2015.01)

(58) Field of Classification Search
CPC .......... B22C 7/00; B22D 19/00; B22D 23/00; B81B 2201/035; B81C 1/00634
(Continued)

(56) References Cited

U.S. PATENT DOCUMENTS 5,679,436 A   10/1997 Zhao
6,015,599 A    1/2000 Keller et al.
(Continued)

FOREIGN PATENT DOCUMENTS

EP    2 236 455 A1   10/2010

OTHER PUBLICATIONS

Bongrain, Alexandre, et al., "Selective nucleation in silicon moulds for diamond MEMS fabrication", Journal of Micromechanics & Microengineering, Jul. 1, 2009, pp. 1-7, vol. 19, No. 7, XP020160890, Institute of Physics Publishing, Bristol, GB, ISSN: 0960-1317.

(Continued)

*Primary Examiner* — Kevin P Kerns
(74) *Attorney, Agent, or Firm* — Oblon, McClelland, Maier & Neustadt, L.L.P.

(57) ABSTRACT

A method of fabricating a micromechanical part in a single-piece made of a synthetic carbon-allotrope includes forming a substrate which includes the negative cavity for the micromechanical part to be fabricated, coating the negative cavity of the substrate with a layer of the synthetic carbon allotrope in a thickness of between 0.2 μm and 20 μm, the thickness being less than the depth of the negative cavity, removing from the substrate a larger thickness than the thickness of the deposited layer, so as to leave a limited thickness of the layer of material in the negative cavity, and removing the substrate so as to release the single-piece micromechanical part formed in the negative cavity comprising an external surface of comparable roughness to that of the substrate.

11 Claims, 4 Drawing Sheets

(51) Int. Cl.
*B81B 1/00* (2006.01)
*B81C 99/00* (2010.01)
*B81C 1/00* (2006.01)

(58) Field of Classification Search
USPC .................................... 164/44, 45, 46, 91
See application file for complete search history.

(56) References Cited

U.S. PATENT DOCUMENTS

| | | | |
|---|---|---|---|
| 8,193,076 B2 | 6/2012 | Moslehi et al. | |
| 8,278,192 B2 | 10/2012 | Wang et al. | |
| 8,636,050 B2 * | 1/2014 | Cusin | B81C 99/0085 164/45 |
| 2003/0111759 A1 | 6/2003 | Wood et al. | |
| 2010/0282668 A1 * | 11/2010 | Cooper | B01D 67/0072 210/500.21 |

OTHER PUBLICATIONS

European Search Report of EP 11 15 3244, dated Jun. 21, 2011.
Karczemska A et al: "Diamond Microfluidic Devices manufactured with the replica method" ,Perspective Technologies and Methods INMEMS Design, 2009. MEMSTECH 2009. 2009 5th International Conference on, IEEE,Piscataway, NJ, USA,Apr. 22, 2009, pp. 17-19, XP031471595,ISBN: 978-966-2191-06-6 A figures 1,2 section "I. Introduction" section "II Transfer moulding technique".
Prasad S V et al: "Application of Diamond-Like Nanocomposite Tribological Coatings on LIGA Microsystem Parts", Journal of Microelectromechanical Systems, IEEE Service Center, Piscataway, NJ, US, vol. 18, No. 3, Jun. 1, 2009, pp. 695-704, XP011254803, I SSN: 1057-7157 figure 4 p. 696.
International Search Report issued in corresponding application PCT/EP2012/050127, completed on Feb. 9, 2012 and mailed Feb. 17, 2012.

* cited by examiner

COMPLEX MICROMECHANICAL PART

This is a National Phase Application in the United States of International Patent Application PCT/EP2012/050127 filed Jan. 5, 2012, which claims priority on European Patent Application No. 11153243.8 of Feb. 3, 2011. The entire disclosures of the above patent applications are hereby incorporated by reference.

FIELD OF THE INVENTION

The invention relates to a complex micromechanical part made from any material, such as, for example, a carbon-based material, and a method of fabricating a part of this kind.

BACKGROUND OF THE INVENTION

Fabrication of a micromechanical part purely from synthetic diamond or DLC (diamond like carbon) is very expensive and is not tribologically advantageous due to the unfavourable roughness generated by the thick layer deposition process or by an etching method in the bulk. Consequently, it is currently preferred to coat the micromechanical part using a thin layer of synthetic diamond or DLC, although this does not allow all shapes to be obtained.

SUMMARY OF THE INVENTION

It is an object of this invention to overcome all or part of the aforecited drawbacks by proposing a micromechanical part having a complex geometry which uses a minimum quantity of material with greatly improved roughness and a very favourable scrap rate and production cost.

The invention therefore relates to a method for fabricating a single-piece material micromechanical part, characterized in that it includes the following steps:

a) Forming a substrate comprising the negative cavity for said micromechanical part to be fabricated.
b) Coating said negative cavity of the substrate with a layer of material.
c) Removing from the substrate a greater thickness than that of the deposited layer, so as to leave a limited thickness of said layer in said negative cavity.
d) Removing the substrate to release the micromechanical part formed in said negative cavity.

It is thus clear that the method allows the fabrication of a single-piece micromechanical part, i.e. with no discontinuity of material, which has a "skin" of material, i.e. a small amount of material, the external surface of which reproduces the very favourable roughness of the substrate which very substantially reduces the cost of the material required on the outer layer and improves overall roughness, especially on the external surface, to perfect its tribological performance.

In accordance with other advantageous features of the invention:

The negative cavity includes a wall forming a toothing;
The material is crystallised or amorphous carbon-based;
Between step b) and step c), the method includes step e): filling the cavity coated in the first material with a second material so as to obtain, after steps c) and d), a micromechanical part in a first material which is reinforced and/or decorated with a second material;
Between step c) and step d), the method includes step f): filling the cavity coated in the first material with a second material so as to obtain, after step d), a micromechanical part in a first material which is reinforced and/or decorated with a second material;
In step f), the second material is formed to protrude from said cavity so as to form an additional functional element of the micromechanical part;
The second material includes a metal or metal alloy;
The micromechanical part forms an exterior part, balance spring, balance, pallet lever, bridge, wheel set or escape wheel of a timepiece.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

As explained above, the invention relates first of all to a single-piece micromechanical part for example made of a carbon-based material. "Carbon based" means a synthetic carbon allotrope in crystalline form, such as diamond or one or several layers of graphene, or in amorphous form, such as diamond like carbon (DLC).

Of course, advantageously according to the invention, other types of materials, which can be deposited in layers and which have tribological advantages, may be used as an alternative to a synthetic carbon allotrope. This alternative material may be, for example, a silicon based compound, i.e. for example silicon nitride, silicon oxide or silicon carbide.

This micromechanical part was devised for applications within the field of horology. However, other domains may very well be envisaged, such as, in particular, aeronautics, jewelry or the automobile industry.

Within the field of horology, this micromechanical part may, for example, form part of the exterior of the watch, the balance spring, balance, pallet levers, bridges or even the wheel sets, such as the escape wheels, completely or partially from a base of synthetic carbon allotrope or an alternative material as explained hereinbefore.

A first embodiment of the method of fabricating this micromechanical part is presented in FIGS. 1 to 5. In step a, the method consists in forming a negative cavity 3 in a substrate 1, for the future micromechanical part 11, 21, 31, 41. A large variety of substrates 1 is possible. Preferably, the material of substrate 1 is selected for its very low roughness, i.e. the natural feature of having a smooth surface.

Figure 1:
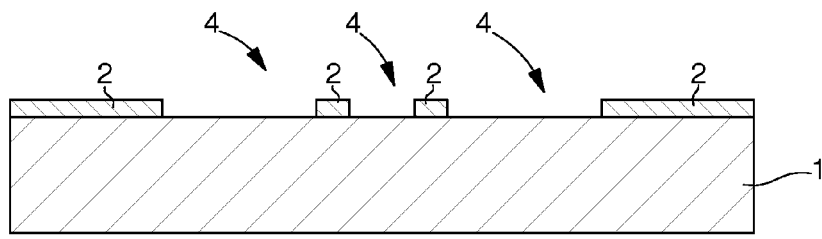
FIGS. 1 to 5 are views of successive steps of the fabrication method according to a first embodiment of the invention.
Figure 2:
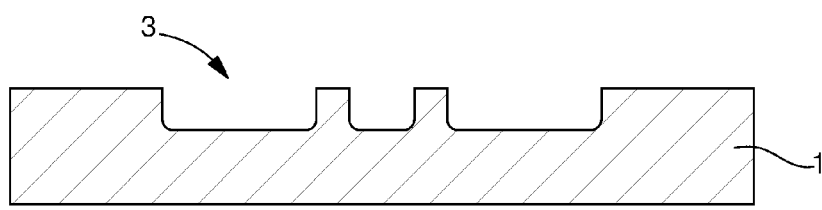
Figure 3:
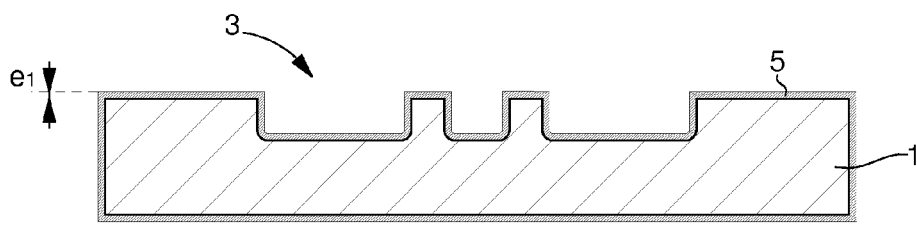

By way of example, FIGS. 1 and 2 show step a formed from a silicon substrate 1 for which it is possible to obtain very good roughness, i.e. an arithmetic mean deviation Ra of substantially less than 10 nm. Thus, in a first phase illustrated in FIG. 1, substrate 1 is coated with a mask 2 having holes 4 which leave a top portion of substrate 1 exposed. In a second phase, etching is performed in holes 4. This may be wet or dry etching. Finally, in a third phase illustrated in FIG. 2, the mask 2 is removed leaving only the negative cavity 3 made in substrate 1.

A second step b consists in coating at least negative cavity 3 with a layer 5 of thickness $e_1$ of the material desired for the future micromechanical part. In the example illustrated in FIG. 3, substrate 1 is entirely coated with a layer 5, i.e. at least in cavity 3 etched in step a. Like the deposited material, the type of deposition can be very varied. In a non-limiting manner, step b may include chemical vapour phase deposition, physical vapour phase deposition or electrodeposition.

Figure 4:
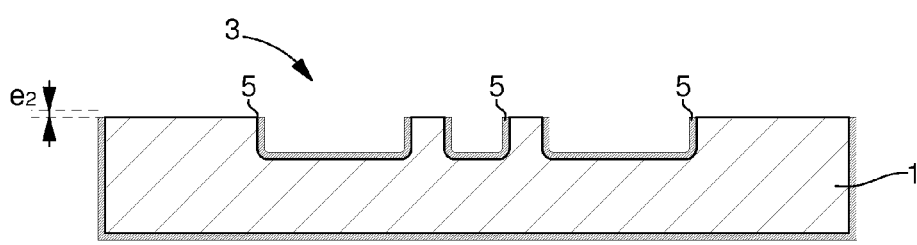

In a third step c, the method consists in removing one portion of substrate 1 coated with layer 5, in order to leave a limited thickness of said layer 5 in said negative cavity 3. Preferably according to the invention, a larger thickness $e_2$ is removed from substrate 1 than thickness $e_1$ of layer 5, as illustrated in FIG. 4. It is thus clear that the layer 5 present in cavity 3 of substrate 1 is henceforth independent, i.e. not joined to the rest of layer 5 deposited in step b.

In a fourth and last step d of the first embodiment, the method consists in removing substrate 1 so as to release the micromechanical part formed in cavity 3. Consequently, in the above example in which substrate 1 is made of silicon, step d may consist in a selective etch of the silicon. This may, for example, be obtained by a chemical etch using a bath comprising tetramethylammonium hydroxide (TMAH and TMAOH).

Figure 5:
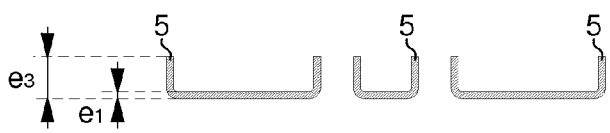

At the end of step d, as illustrated in FIG. 5, there is obtained a micromechanical part formed exclusively by layer 5 whose geometry matches cavity 3 present in substrate 1. Advantageously, the external surface, i.e. the surface which was directly in contact with substrate 1, has very good roughness, i.e. comparable to that of substrate 1, and is preferably used as the mechanical contact surface. Finally, for a height $e_3$ of the micromechanical part comprised between 10 µm and 500 µm, a thickness $e_1$ of only 0.2 µm to 20 µm of layer 5 is deposited. The savings in material and production costs due to the shortened time in step b are thus immediately clear.

Consequently, it is clear that a micromechanical part is obtainable whose elementary section is formed by at least two secant and non-aligned segments, so that one of said at least two segments forms the height $e_3$ of the micromechanical part. Said height $e_3$ is greater than the thickness $e_1$ of each segment. Naturally, depending on the complexity of cavity 3, the elementary section may be a simpler, substantially U-shaped section, i.e. comprising three segments.

Thus, depending on the complexity of cavity 3, the micromechanical part is formed by the projection of at least one elementary section having two or three segments on a rectilinear or non-rectilinear directrix (including revolution). Moreover, it is not any more difficult to form very complex or variable sections such as, for example, forming a toothing on a wall of cavity 3 which will form a corresponding toothing for one of the segments of the section.

Figure 6:
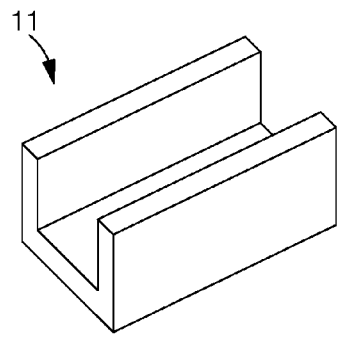
FIGS. 6 to 10 are views of example micromechanical parts produced according to a first embodiment of the invention.
Figure 7:
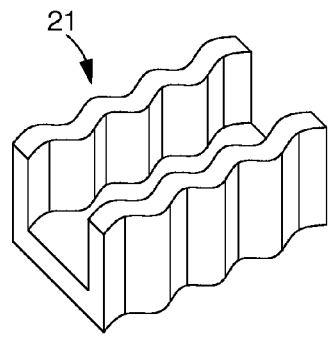

By way of non-limiting example, micromechanical parts 11, 21, 31, 41 which can be produced according to the first embodiment, are shown in FIGS. 6 to 10. Thus, FIG. 6 shows a micromechanical part 11 whose substantially U-shaped elementary section is projected on a rectilinear directrix. FIG. 7 shows a micromechanical part 21 having a similar elementary section to that of micromechanical part 11 but which is projected on a sinusoidal, i.e. non-rectilinear directrix. It is also clear that it is possible to produce a micromechanical part formed half from part 11 and the other half from part 21, both transversely and longitudinally in a single-piece, without complicating the method.

Figure 8:
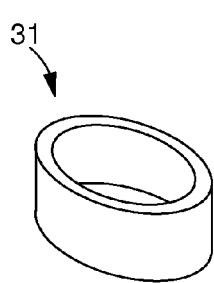
Figure 9:
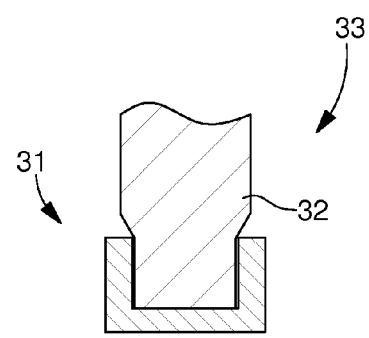

FIGS. 8 and 9 show an example elementary section capable of having two segments which is projected in revolution to obtain a micromechanical part 31 in the form of a cap. This type of micromechanical part could, for example, be secured to an element to improve its tribological relationship with another member. By way of example, micromechanical part 31 may be secured to the end of a pivot 32 of an arbour 33 so that pivot 32 cooperates with a bearing via micromechanical part 31.

Figure 10:
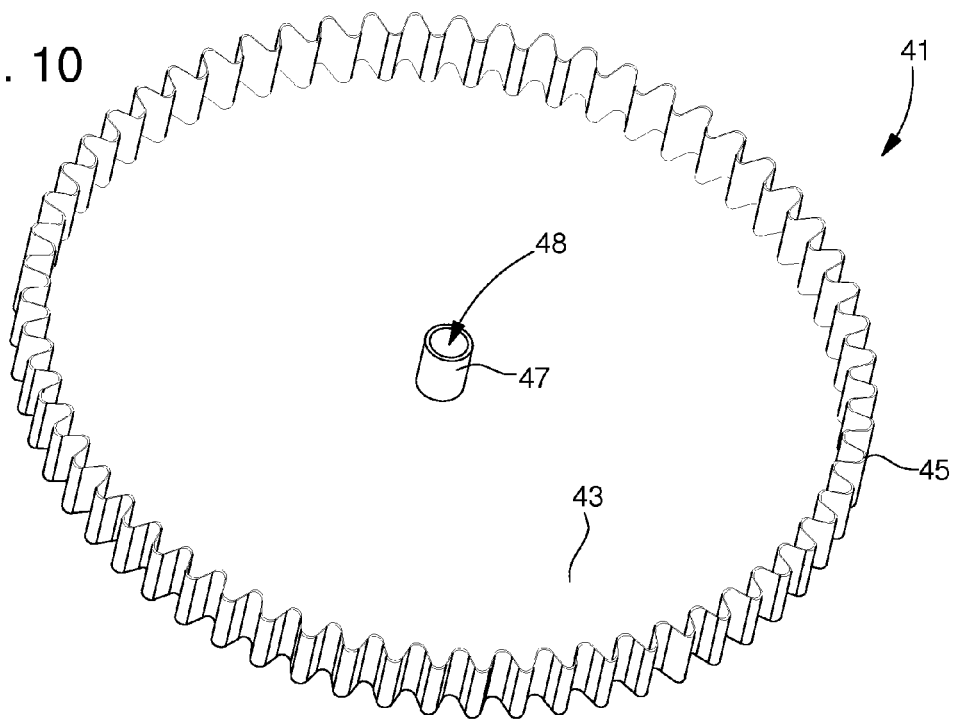

Finally, FIG. 10 shows a last example of a more complex micromechanical part 41, which does not make the method more difficult to implement. Micromechanical part 41 includes a substantially discoid plate 43 from the periphery of which a toothing 45 projects orthogonally and whose centre comprises a pipe 47 forming a hole 48 for cooperation, for example, with a pivot pin. FIG. 10 thus shows that that the thickness of toothing 45 and of plate 43 is formed by the thickness $e_1$ of layer 5 deposited in step b of the method.

Figure 11:
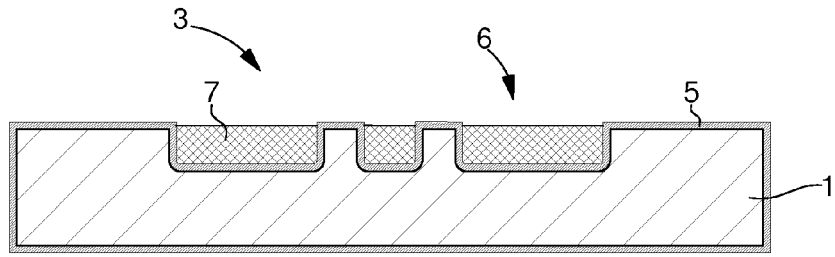
FIGS. 11 to 13 are diagrams of successive steps of a fabrication method according to a second embodiment of the invention.
Figure 12:
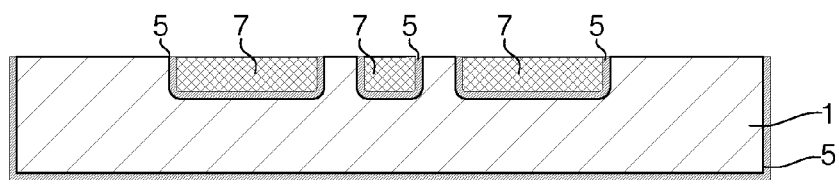

A second alternative embodiment to the first embodiment explained above is shown in FIGS. 11 to 13. Steps a to d remain identical to the first embodiment. However, as illustrated in FIG. 11, between step b and step c, step e is performed consisting in filling the hollows 6 in cavity 3 coated in first material 5, with a second material 7. Thus, after steps c and d which are similar to the first embodiment and illustrated respectively in FIGS. 12 and 13, there is obtained a micromechanical part made in a first material 5 reinforced and/or decorated with a second material 7.

Preferably, the filling of hollows 6 is achieved by galvanic deposition or hot deformation. The second material is preferably a metal or metal alloy which may or may not be amorphous. However, in an alternative, there is nothing to prevent the type of deposition and/or nature of the deposited material from being changed.

Consequently, in the fourth step c, not only is the thickness of said layer 5 limited in said negative cavity 3 but the deposition 7 of the second material is flattened and preferably made flush with said limited part of layer 5. Finally, in a fifth and final step d of the second embodiment, the method consists in removing substrate 1 so as to release the micromechanical part formed in cavity 3, with the same variants and advantages as in the first embodiment.

Figure 13:
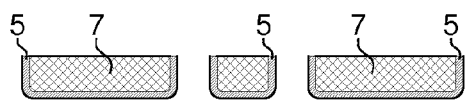

At the end of step d, as illustrated in FIG. 13, there is obtained a micromechanical part formed by layer 5, whose geometry matches cavity 3 present in substrate 1 and which is reinforced and/or decorated with deposition 7. Advantageously, the external surface formed by layer 5, i.e. the surface which was directly in contact with substrate 1, has very good roughness, i.e. comparable to that of substrate 1 and is preferably used as the contact surface.

According to another advantage of the invention, it is henceforth possible to coat parts with thin layers, which was impossible to achieve previously because of the particular conditions required for thin layer deposition, such as, for example, the pressure, temperature or compounds used. By way of non-limiting example it is thus possible, advantageously according to the invention, to form a mainly metallic part from a deposition 7, which is diamond coated from layer 5, whereas currently, to the Applicant's knowledge, it is difficult to diamond coat a metallic part.

Finally, for a height $e_3$ of the micromechanical part of between 10 µm and 500 µm, a thickness $e_1$ of layer 5 of between only 0.2 µm and 20 µm is deposited, the rest being made up by deposition 7. The savings in material costs and production costs due to the shortened time of step b of depositing layer 5 are immediately clear, with the rest of the part being formed by less expensive deposition 7.

Figure 14:
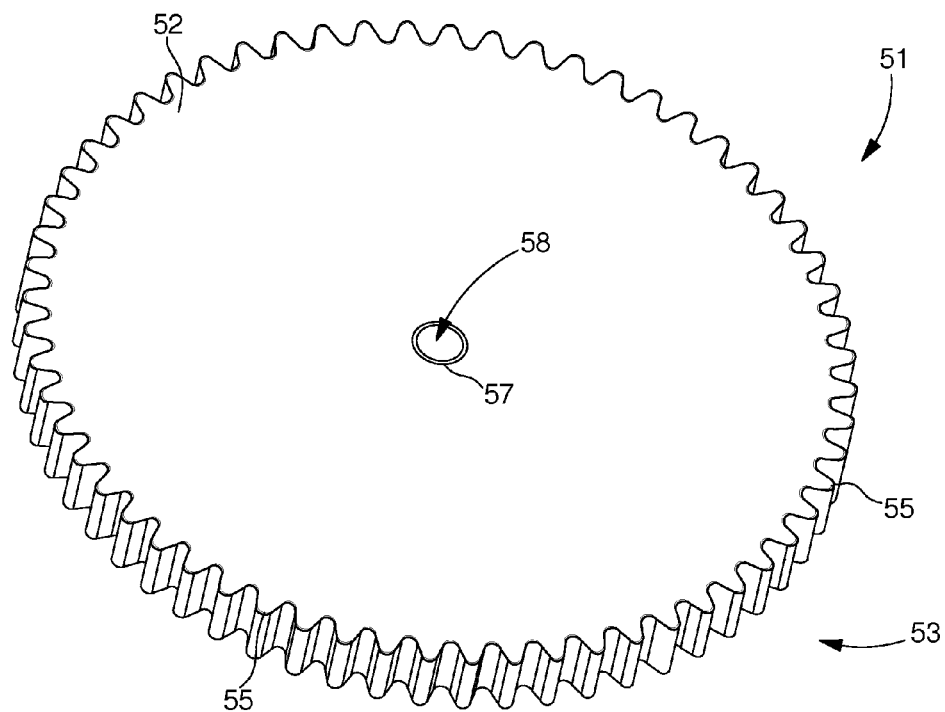
FIG. 14 is a view of an example micromechanical part produced according to a second embodiment of the invention.

Consequently, it is clear that it is possible to obtain a micromechanical part with the same elementary sections as in the first embodiment. By way of non-limiting example, FIG. 14 shows a micromechanical part 51 which can be produced according to the second embodiment. Micromechanical part 51 includes a substantially discoid plate 53, comparable to plate 43 of FIG. 10, from whose periphery a toothing 55 projects orthogonally and whose centre includes a pipe 57 forming a hole 58 for cooperation, for example, with a pivot pin. FIG. 14 thus shows that that the thickness of toothing 55 and of pipe 57 are formed by the thickness $e_1$ of layer 5 deposited in step b of the method, the rest being made up by portion 52 formed by deposition 7 in step e.

Figure 15:
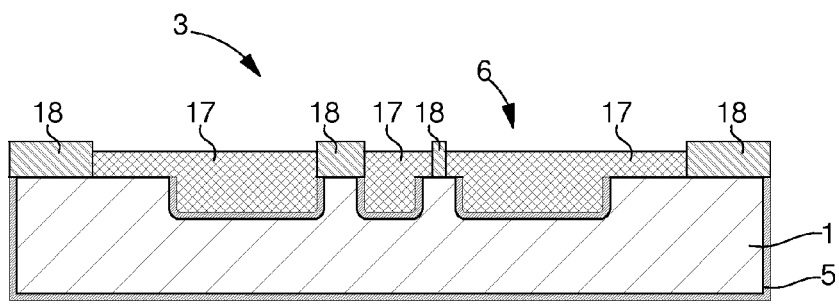
FIGS. 15 and 16 are views of successive steps of a fabrication method according to a third embodiment of the invention.
Figure 16:
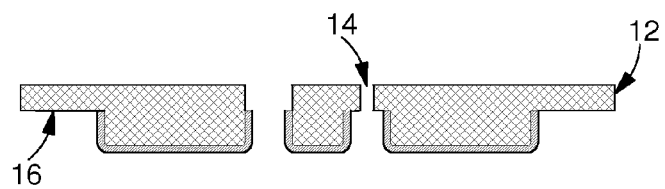

FIGS. 15 to 16 show a third alternative embodiment to the first embodiment explained above. Steps a to d remain identical to the first embodiment. However, as illustrated in FIG. 15, a fourth step f is performed between step c and step d, which consists in filling the hollows 6 in cavity 3, coated in first material 5, with a second material 17. Thus, after step d, which is similar to the first embodiment and illustrated in FIG. 16, there is obtained a micromechanical part, made in first material 5, reinforced and/or decorated with a second material 7.

Compared to step e of the second embodiment, step f is intended to fill hollows 6 of cavity 3, and, advantageously, can also form a protruding level of thickness $e_3$ so as to form an additional functional element of the micromechanical part as illustrated in FIG. 15.

Step f preferably includes a phase of structuring a mould 18 on substrate 1 after step c, followed by a phase of filling the recess jointly formed by hollows 6 of cavity 3 and the pierced holes in mould 18. Finally, step f includes a phase of removing mould 18 from the surface of substrate 1.

The phase of structuring mould 18 may, for example, be formed by photolithography using a negative or positive photosensitive resin. Further, the filling phase may, for example, be performed using electrodeposition. The second material is preferably a metal or metal alloy which may or may not be amorphous. However, there is nothing to prevent the type of deposition and/or nature of the deposited material from being changed.

Step f may also include a last step of lapping and/or polishing the top portion of deposition 17. Consequently, in a fifth and final step d of the third embodiment, the method consists in removing substrate 1, so as to release the micromechanical part formed in cavity 3, with the same advantages as in the first embodiment.

At the end of step d, as illustrated in FIG. 16, there is obtained a micromechanical part formed by layer 5, whose geometry matches cavity 3 present in substrate 1 and which is reinforced and/or decorated with deposition 17. Advantageously, the external bottom surface formed by layer 5, i.e. the surface which was directly in contact with substrate 1, has very good roughness, i.e. comparable to that of substrate 1 and is preferably used as the contact surface.

According to another advantage of the invention, it is henceforth possible to coat parts with thin layers, which was impossible to achieve previously because of the particular conditions required for thin layer deposition, such as, for example, the pressure, temperature or compounds used. By way of non-limiting example it is thus possible, advantageously according to the invention, to form a mainly metallic part from a deposition 17, which is partially diamond coated from layer 5, whereas currently, to the Applicant's knowledge, it is difficult to diamond coat a metallic part.

Moreover, in the third embodiment, the micromechanical part also includes a second top level entirely formed by deposition 17, i.e. with no layer 5, so as to form an additional functional element of the micromechanical part. This functional element may, in a non-limiting manner, be a toothing 12, hole 14 and/or a shoulder 16, intended, for example, to cooperate with another member.

As in the first two embodiments, the savings in material costs and production costs due to the shortened layer 5 deposition step are immediately clear, with the remainder of the part being formed by a less expensive deposition 17, yet offering a potentially very complex geometry.

Figure 17:
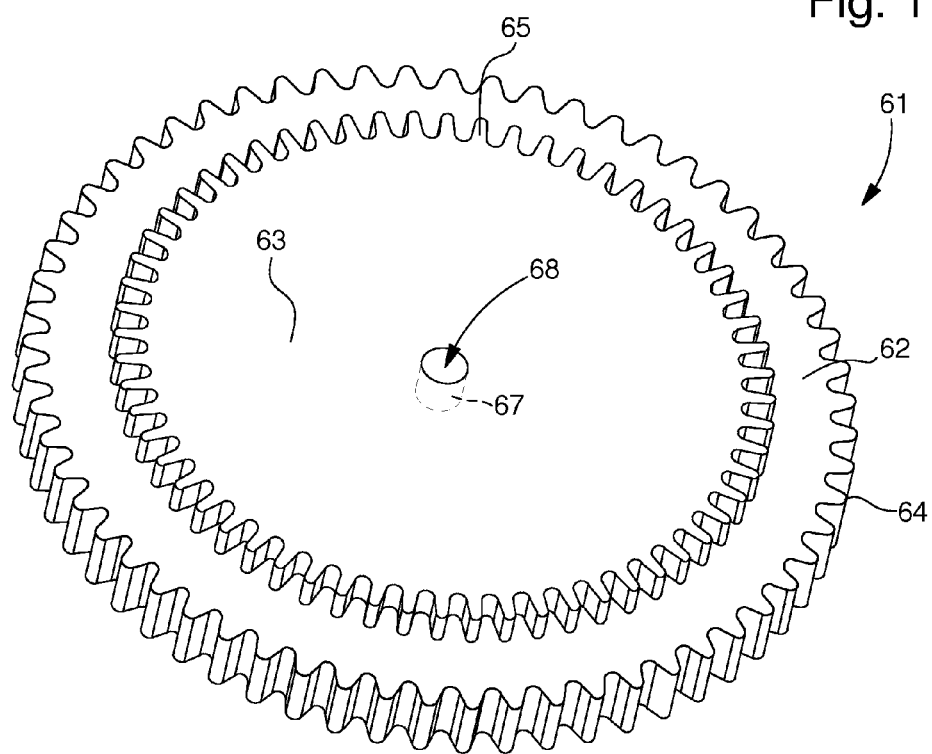
FIG. 17 is a view of an example micromechanical part produced according to a third embodiment of the invention.

Consequently, it is clear that it is possible to obtain a micromechanical part with the same elementary sections as in the first two embodiments. By way of non-limiting example, FIG. 17 shows a micromechanical part 61, which can be produced according to the third embodiment. Micromechanical part 61 includes a substantially discoid plate 63, comparable to plate 43 of FIG. 10, from whose periphery a toothing 65 projects orthogonally and whose centre includes a pipe 67 forming a hole 68, the rest being filled by deposition 17 in step f. On a second level, exclusively formed by deposition 17, micromechanical part 61 has a wheel 62 whose periphery includes a toothing 64 and whose centre includes a hole of preferably smaller section than hole 68, intended, for example, to cooperate with a pivot pin.

Of course, this invention is not limited to the illustrated example but is capable of various variants and alterations that will appear to those skilled in the art. In particular, several micromechanical parts, which may or may not be of identical design, may be fabricated at the same time on the same substrate. Further, in the example of FIG. 4 or of FIG. 12, it is seen that the removal of substrate 1 also forms a part of substantially U-shaped section formed by layer 5 on the periphery and the bottom portion of substrate 1.

Consequently, it is not only possible to form several cavities 3, which may or may not be identical, on substrate 1, but also to form the cavities on several faces of substrate 1, i.e. steps a and c, and possibly e or f may be applied to several faces of substrate 1. In the case of the second and third embodiments, it is therefore possible to envisage obtaining a single-piece part formed by layer 5 on the periphery and/or bottom portion of substrate 1 and a reinforced and/or decorated part formed by layer 5 and deposition 7, 17 on the top portion of substrate 1.

Further, the embodiments can be combined with each other. Thus, by way of non-limiting example, part 51 may be produced via the third modified embodiment. Indeed, steps a to c could be implemented followed by a step f with a similar deposition 17 to deposition 7 of the second embodiment, i.e. not protruding from cavity 3. Evidently, the modified step f of the third embodiment would be similar to step e of the second embodiment but performed after step c and not after step b.

Finally, although the Figures show substantially perpendicular segments, it is clear that the angle that they form in relation to each other may also be acute or obtuse.

The invention claimed is:

1. A method of fabricating a micromechanical part in a single-piece made of a synthetic carbon-allotrope, comprising:
   a) forming a substrate which includes a negative cavity for the micromechanical part to be fabricated;
   b) coating the substrate, including the negative cavity and a portion of the substrate surrounding the negative cavity, with a layer of the synthetic carbon allotrope in a thickness of between 0.2 µm and 20 µm, the thickness being less than the depth of the negative cavity;
   c) removing, after step b), from the substrate a larger thickness than the thickness of the layer of the synthetic carbon allotrope deposited by the coating such that the layer of the synthetic carbon allotrope is removed from the portion of the substrate surrounding the negative cavity, so as to leave a limited thickness of the layer of material in the negative cavity; and
   d) removing the substrate so as to release the single-piece micromechanical part formed in the negative cavity comprising an external surface of comparable roughness to that of the substrate.

2. The method according to claim 1, wherein the negative cavity includes a wall forming a toothing.

3. The method according to claim 1, wherein the synthetic carbon allotrope is in crystallised form.

4. The method according to claim 1, wherein the synthetic carbon allotrope is in amorphous form.

5. The method according to claim 1, wherein between step b) and step c), the method includes the following step:
   e) filling the cavity coated with the synthetic carbon allotrope with a second material so that, after steps c) and d), there is obtained a micromechanical part in a synthetic carbon allotrope reinforced and/or decorated with a second material.

6. The method according to claim 5, wherein the second material includes a metal or metal alloy.

7. The method according to claim 1, wherein between step c) and step d), the method includes the following step:
   f) filling the cavity coated with the synthetic carbon allotrope with a second material so that, after step d), there is obtained a micromechanical part made of a synthetic carbon allotrope reinforced and/or decorated with a second material.

8. The method according to claim 7, wherein, in step f), the second material is formed protruding from the negative cavity in order to form an additional functional element of the micromechanical part.

9. The method according to claim 7, wherein the second material includes a metal or metal alloy.

10. The method according to claim 1, wherein the micromechanical part forms an exterior part, balance spring, balance, pallet lever, bridge, wheel set or escape wheel of a timepiece.

11. The method according to claim 1, wherein, after step c), a portion of the layer of the synthetic carbon allotrope formed in the negative cavity is not joined to a portion of the layer of the synthetic carbon allotrope formed on the portion of the substrate surrounding the negative cavity.

* * * * *